United States Patent
Yun et al.

(10) Patent No.: US 7,645,659 B2
(45) Date of Patent: Jan. 12, 2010

(54) POWER SEMICONDUCTOR DEVICE USING SILICON SUBSTRATE AS FIELD STOP LAYER AND METHOD OF MANUFACTURING THE SAME

(75) Inventors: Chong-man Yun, Seoul (KR); Kwang-hoon Oh, Seoul (KR); Kyu-hyun Lee, Bucheon-si (KR); Young-chull Kim, Incheon Meropolitan (KR)

(73) Assignee: Fairchild Korea Semiconductor, Ltd., Bucheon Si (KR)

( * ) Notice: Subject to any disclaimer, the term of this patent is extended or adjusted under 35 U.S.C. 154(b) by 474 days.

(21) Appl. No.: 11/289,823

(22) Filed: Nov. 30, 2005

(65) Prior Publication Data
US 2007/0120215 A1  May 31, 2007

(51) Int. Cl.
*H01L 23/58* (2006.01)
(52) U.S. Cl. .............................. 438/202; 257/E21.383; 438/675
(58) Field of Classification Search .................. 438/137, 438/299, 135, 138, 675, 141, 202, 270; 257/135, 257/339, 346, 496, 327, E29.197, E21.383, 257/E29.198, 492, 293, E23.001, E21.476
See application file for complete search history.

(56) References Cited
U.S. PATENT DOCUMENTS

| | | | |
|---|---|---|---|
| 6,309,920 B1 | 10/2001 | Laska et al. | |
| 6,426,248 B2 | 7/2002 | Francis et al. | |
| 6,482,681 B1 | 11/2002 | Francis et al. | |
| 6,524,894 B1 | 2/2003 | Nozaki et al. | |
| 6,621,120 B2 | 9/2003 | Otsuki et al. | |
| 6,686,613 B2 | 2/2004 | Matsudai et al. | |
| 6,707,111 B2 | 3/2004 | Francis et al. | |
| 6,762,080 B2 | 7/2004 | Linder | |
| 6,798,040 B2 | 9/2004 | Reznik | |
| 6,825,110 B2 | 11/2004 | Linder et al. | |
| 2002/0081784 A1* | 6/2002 | Kobayashi et al. | 438/137 |

* cited by examiner

Primary Examiner—Thomas L Dickey
Assistant Examiner—Fazli Erdem
(74) *Attorney, Agent, or Firm*—Thomas R. FitzGerald, Esq.; Hiscock & Barclay, LLP

(57) ABSTRACT

Provided are a power semiconductor device using a silicon substrate as a FS layer and a method of manufacturing the same. A semiconductor substrate of a first conductivity type is prepared. An epitaxial layer is grown on one surface of the semiconductor substrate. Here, the epitaxial layer is doped at a concentration lower than that of the semiconductor substrate and is intended to be used as a drift region. A base region of a second conductivity type is formed in a predetermined region of the epitaxial layer. An emitter region of the first conductivity type is formed in a predetermined region of the base region. A gate electrode with a gate insulating layer is formed on the base region between the emitter region and the drift region of the epitaxial layer. A rear surface of the semiconductor substrate is ground to reduce the thickness of the semiconductor substrate, thereby setting an FS region of the first conductivity type. A collector region of the second conductivity type is formed on the ground surface of the semiconductor substrate of the FS region, thereby forming an FS-IGBT.

9 Claims, 6 Drawing Sheets

POWER SEMICONDUCTOR DEVICE USING SILICON SUBSTRATE AS FIELD STOP LAYER AND METHOD OF MANUFACTURING THE SAME

BACKGROUND OF THE INVENTION

1. Field of the Invention

The present invention relates to a power semiconductor device, and more particularly, to a power semiconductor device formed using an epitaxial layer on a substrate and a method of manufacturing the power semiconductor layer.

2. Description of the Related Art

Insulated gate bipolar transistors (IGBTS) are favorably considered as power semiconductor devices combining the high-speed switching characteristic of a high-power metal oxide silicon field effect transistor (MOSFET) and the high-power characteristic of a bipolar junction transistor (BJT). A field stop (FS)-IGBT is a kind of the IGBTs. The FS-IGBT can be regarded as a soft punch through IGBT or a shallow punch through IGBT. The FS-IGBT can be understood as a combination of a punch through (PT)-IGBT and a non-punch through (NPT)-IGBT and thus can be considered as having the advantages of the PT-IGBT and the NPT-IGBT, such as low saturation collector voltage ($V_{ce,sat}$), easy parallel operation, and ruggedness.

Nevertheless, the manufacture of the FS-IGBT requires a thinner flat wafer than the manufacture of the NPT-IGBT, and also requires an n layer between a P collector region and N⁻ drift region so as to prevent the expansion of a depletion region into the P collector region.

There have been proposed various methods for manufacturing the FS-IGBT. However, those methods often exclude epitaxial layers and thus the FS-IBGT is formed in a very thin substrate by a process of implanting and diffusing impurity ions into the very thin wafer.

Since an FS (field stop) layer is formed through the ion implantation or diffusion processes, a high-energy ion implantation process or a wafer thinning process is required before the forming of the FS layer. The process to form the IGBT includes forming the N⁻ drift layer on the FS layer and forming a double diffused MOSFET (DMOS) operation thereon. Those processes are performed on a very-thin wafer and such thin wafers are fragile and are prone to warp or break during ion implantation, annealing and photolithography. Accordingly, there is required a method that makes it possible to use thicker wafers or substrates during the general semiconductor manufacturing processes and to introduce an N-type FS layer between a P collector layer and an N⁻ drift layer that are required in the FS-IGBT structure.

SUMMARY OF THE INVENTION

The present invention provides a power semiconductor device and a manufacturing method that enables one skilled in the art to use a thicker, more rugged wafer and avoid the warping and breakage experienced by conventional thin wafers. The invention uses the thicker wafer during the semiconductor manufacturing processes and introduces an N-type FS layer between a P collector layer and an N⁻ drift layer that are required in an FS-IGBT structure.

According to one aspect, the invention provides a method of manufacturing a power semiconductor device, in particular and IGBT. The device has a substrate region with a field stop and collector. An epitaxial layer on the field stop has a drift region, base and emitter. The field stop is relatively thin because a large portion of the initial substrate is removed.

The initial substrate is preferably a wafer sliced from an elongated single-crystal Czochralski (CZ)-grown cylinder. The CZ substrate is processed by ion implantation and diffusion to create a thick, initial field stop (FS) region doped with a first polarity dopant. That substrate is then processed to grow an epitaxial layer. The epitaxial layer is doped by ion implanting and diffusion to create a drift region. The drift region has a doping concentration less than the FS region in the substrate and of the same polarity. The surface of the epitaxial region is doped by ion implantation and diffusion to form first a base region of opposite polarity and then, in the base region, an emitter region, highly doped and of the same polarity as the drift and FS regions. The process then reduces the size of the initial FS region by removing material from the surface of the substrate until the FS region is reduced to its desired thickness. Removal is made by grinding the surface of the wafer or by using chemical removal techniques or by a combination of mechanical and chemical operations. While the term "grinding" is used, those skilled in the art understand that the removal process may be performed by a suitable lapping/polishing machine.

At the end of the process the drift zone in the epitaxial layer has a concentration lower than that of the FS region in the semiconductor substrate. Further steps include forming a gate electrode with a gate insulating layer on the base region between the emitter region and the drift region of the epitaxial layer and forming an emitter electrode contacting with the base region and the emitter region. The step of removing a substantial portion of the rear surface of the semiconductor substrate opposite of the gate electrode to reduce the thickness of the semiconductor substrate sets the FS region of the first conductivity type to a desired thickness that controls a number of operational characteristics of the device. After it is at the desired thickness, the process forms a collector region of the second conductivity type on the ground surface of the semiconductor substrate of the FS region.

At this time, the power semiconductor device may include an FS-IGBT.

The semiconductor substrate may have a constant concentration profile of N-type impurities in a depth direction.

The semiconductor substrate may be an $N^0$ semiconductor substrate doped with the N-type impurities at a concentration of $1E15/cm^3$ to $2E16/cm^3$. In this patent the notation "$N^0$" indicates a N-type region from the original, thick single-crystal substrate.

The FS region may be set to a portion of the $N^0$ semiconductor substrate remaining after the material removal step, thereby having a constant concentration profile in the depth direction.

N-type impurities may be doped at a concentration suitable for a breakdown voltage the device to grown the epitaxial layer.

The forming of the base region may include: selectively ion-implanting impurities of the second conductivity type into a surface of the epitaxial layer; and diffusing the ion-implanted impurities.

The forming of the emitter region may include: selectively ion-implanting impurities of the first conductivity type into a surface of the base region; and diffusing the ion-implanted impurities.

The collector region may be formed of a diffusion layer formed to a constant depth below the ground surface of the remaining semiconductor substrate by ion implantation.

The forming of the collector region may include: ion-implanting impurities of the second conductivity type into the ground surface of the semiconductor substrate; and performing a thermal treatment process on the ion-implanted impurities.

The method may further include: forming an emitter electrode electrically connected to the emitter region; and forming a collector electrode electrically connected to the collector region.

According to another aspect of the present invention, there is provided a power semiconductor device, in particular and IGBT that has a CZ grown substrate with an FS region of a first conductivity type whose thickness has been reduced by grinding or other means and an epitaxial layer with a drift region of the first conductivity type. The drift region has a lower concentration than the FS region of the semiconductor substrate. The epitaxial layer has a base region of a second conductivity type formed in a predetermined surface region of the drift region and an emitter region of the first conductivity type formed in a predetermined surface region of the base region. A gate electrode with a gate insulating layer is on the base region between the drift region and the emitter region. A collector region of the second conductivity type is on the bottom surface of the substrate where the bulk of the substrate has been removed by grinding or other material removal means.

The base region may include a diffusion layer formed by selectively diffusing impurities of the second conductivity type into a surface of the epitaxial layer. The emitter region may include a diffusion layer formed by selectively diffusing impurities of the first conductivity type into a surface of the base region. The collector region may include a diffusion layer formed to a predetermined depth below the ground surface of the semiconductor substrate.

With the invention the concentration of dopants in the FS region is set during the creation of the substrate. The substrate may be grown as an elongated CZ crystal or made with a float zone process by adding dopants during crystal growth or creation rather than by ion implantation and annealing. Such a development allows the user to have a uniform FS in the starting substrate and the used does not have to anneal or implant the starting substrate and can thus save a step of manufacturing. As a alternative, a relatively thick CZ or float zone wafer may be implanted and annealed after it is sliced and before the epitaxial layer is applied to the substrate.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
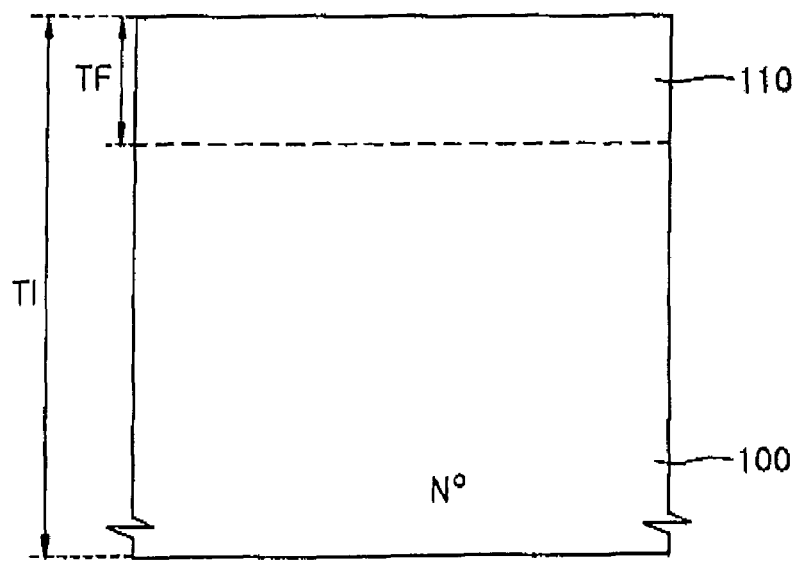
FIGS. 1 through 6 are schematic sectional views illustrating a method of manufacturing a power semiconductor device according to an embodiment of the present invention.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art.

In the embodiments, an $N^-$ epitaxial layer is preferably grown on one surface of an $N^{0-}$ CZ-grown semiconductor substrate to implement a drift region of an IGBT with the $N^-$ epitaxial layer. Also, impurities are selectively diffused to form a $P^+$ base region and an $N^+$ emitter region in the $P^+$ base region on a surface region of the $N^-$ epitaxial layer. A gate electrode is formed on a gate insulating layer to provide a control gate. The control gate is disposed over portions of the $P^+$ base region and an $N^+$ emitter region and on the surface region of the $N^-$ epitaxial layer. The control gate will form a channel that carries control current for turning the device on and off. An emitter electrode is formed such that it contacts with the $P^+$ base region and the $N^+$ emitter region.

In this manner, by a process of forming a DMOS structure on one surface of the $N^+$ epitaxial layer, the gate electrode and the emitter electrode are formed and then an opposite surface (i.e., rear surface) of the $N^0$ semiconductor substrate is ground to reduce the thickness thereof. Accordingly, an $N^0$ doped layer is preferably formed by the grinding of the of the rear surface of the $N^0$ semiconductor substrate. The $N^0$ doped layer may be used as a buffer layer or a field stop (FS) layer of an FS-IGBT.

Thereafter, impurity ions are implanted into the ground surface of the $N^0$ semiconductor substrate and then diffused by annealing. Accordingly, a P collector region contacting with an opposite side of an $N^-$ drift region is formed on the $N^0$ FS layer formed of the thinned $N^0$ semiconductor substrate. Thereafter, a collector electrode contacting the P collector region is formed.

In this FS-IGBT manufacturing method, the $N^0$ substrate and the $N^-$ epitaxial layer formed thereon are used as a basic start structure and thus the subsequent processes can be performed on the substrate with a sufficient thickness. Accordingly, it is possible to preclude the limitations due to the thinned substrate during the MOS forming process.

One of the features of the invention is that it controls the thickness of the FS layer using reliable material removal steps, such as grinding, etching, lapping or polishing. The emitter, base and gate on the surface of the epitaxial layer. The other surface of the wafer is the substrate material. That surface will eventually hold the collector. However, prior to forming the collector a substantial portion of the substrate is removed to set the size of the FS. The thickness of the FS depends upon the desired operating characteristics and ranges of the device. While the thickness of the FS layer is substantially determined by the grinding of the $N^{0-}$ substrate, the concentration of the FS layer depends on the concentration of the $N^{0-}$ substrate. Accordingly, the vertical concentration profile of the FS layer can be constant in a depth (or thickness) direction.

Accordingly, by using one process parameter, for example, changing the thickness of the $N^0$ substrate, it is possible to greatly reduce a change in the concentration of holes implanted from the P collector region into the $N^-$ drift region. Accordingly, it is possible to control saturation collector voltage and a turn-off loss $E_{off}$. That is, it is possible to reduce a change in the saturation collector voltage and the turn-off loss $E_{off}$ depending on the thickness of the FS layer and to greatly reduce a change in a trade-off performance in comparison with an IGBT using the conventional FS layer.

FIGS. 1 through 6 are schematic sectional views illustrating a method of manufacturing a power semiconductor device according to an embodiment of the present invention.

Referring to FIG. 1, a semiconductor substrate 100 of a first conductivity type is prepared. For example, an $N^0$ semiconductor substrate 100 doped with N-type impurities. The semiconductor substrate 100 may be a substrate doped with $N^{0-}$ impurities of a concentration required in an FS layer of an FS-IGBT, that is, a concentration sufficient to prevent a depletion region from expanding into a P collector region that is to be formed on a surface at a collector side. The concentration of the N-type impurities may be about 1E15 to 2E16/cm$^3$. At this time, the concentration profile of the impurities doped into the semiconductor substrate 100 is substantially constant in the vertical depth (or thickness) direction of the semiconductor substrate 100.

The $N^0$ semiconductor substrate 100 may be a substrate manufactured by a Czochralski (CZ) technique that is advantageous for the manufacture of a large-diameter wafer. The CZ technique is more economical than a float zone (FZ) technique. As shown in FIG. 1, the $N^0$ semiconductor substrate 100 has an initial thickness, TI. Shown in dotted lines is the final thickness TF 110 which will become apparent from the following discussion.

Figure 2:
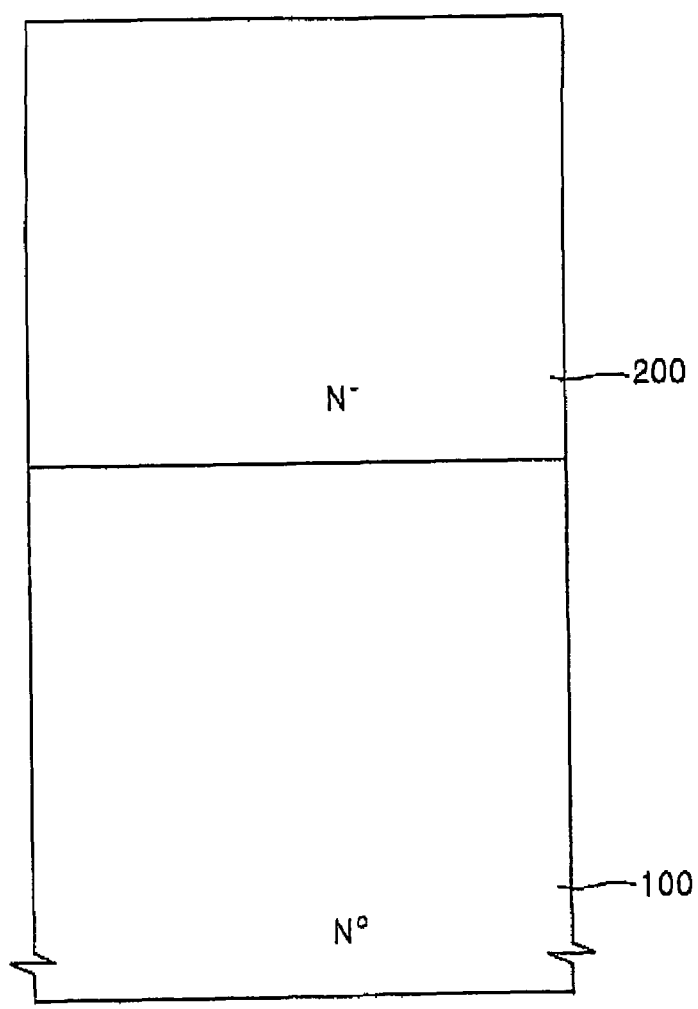

Referring to FIG. 2, an epitaxial layer 200 doped with impurities having the same conductivity type as the first conductivity type is epitaxially grown on the $N^0$ semiconductor substrate 100. At this time, the epitaxial layer 200 is doped at a concentration lower than that of the first conductivity type impurities doped into the semiconductor substrate 100. For example, an $N^-$ epitaxial layer 200 may be epitaxially grown on an $N^0$ semiconductor substrate at a concentration suitable for a breakdown voltage of an N-type device. The $N^-$ epitaxial layer 200 can be understood as a layer that is basically used as an N drift region of an FS-IGBT.

Accordingly, the thickness of the $N^-$ epitaxial layer 200 may be changed according to a breakdown voltage required in the FS-IGBT. When the breakdown voltage of 600 V is required, the thickness of the $N^-$ epitaxial layer 200 may be about 60 μm.

Meanwhile, during the growth of the $N^-$ epitaxial layer 200, the impurities may be doped at a different concentration. Accordingly, it is possible to change or constantly maintain the impurity concentration profile in the vertical depth (or thickness) direction of the $N^-$ epitaxial layer 200. That is, the impurity concentration profile of an $N^-$ drift region substantially formed of the $N^-$ epitaxial layer 200 may be changed according to the intention of the designer.

Figure 3:
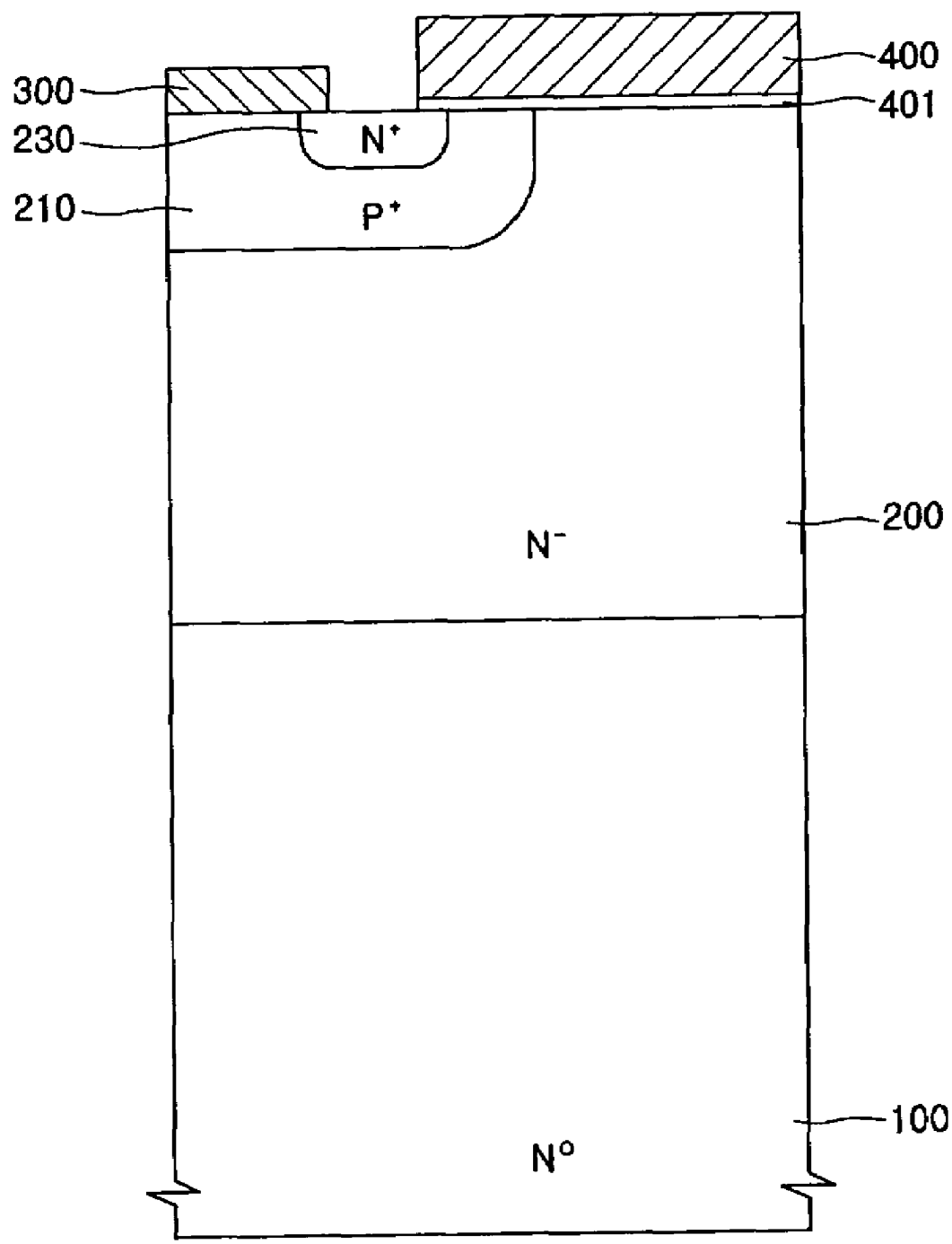

Referring to FIG. 3, impurities of a second conductivity type different than the first conductivity type are selectively doped and diffused into a given region of an upper surface of the $N^-$ epitaxial layer 200, thereby forming a second-conductivity-type base region 210, for example, a P-type base region 210. The P-type base region 210 can be understood as a $P^+$ impurity region and a junction region formed on a surface of the epitaxial layer 200.

Thereafter, impurities of the first conductivity type are selectively doped and diffused into a given region of an upper surface of the $P^+$ base region 210, thereby forming a first-conductivity-type emitter region 230, for example, an N-type emitter region 230. The N-type emitter region 230 can be understood as an $N^+$ impurity region. At this time, the diffusing processes may be simultaneously performed during an annealing process after the implantation of the N-type impurities.

Thereafter, an emitter electrode 300 is formed to contact with the $P^+$ base region 210 and the $N^+$ emitter region 230. A gate insulating layer 401 and a gate electrode 400 are formed over the $N^+$ emitter, the $P^+$ base and a portion of the N-epitaxial layer. The gate electrode 400 will induce a channel in the $P^+$ base between the N+ emitter and the N− drift region. This process may be preformed according to the existing DMOS manufacturing process or the trench gate type MOSFET process.

Figure 4:
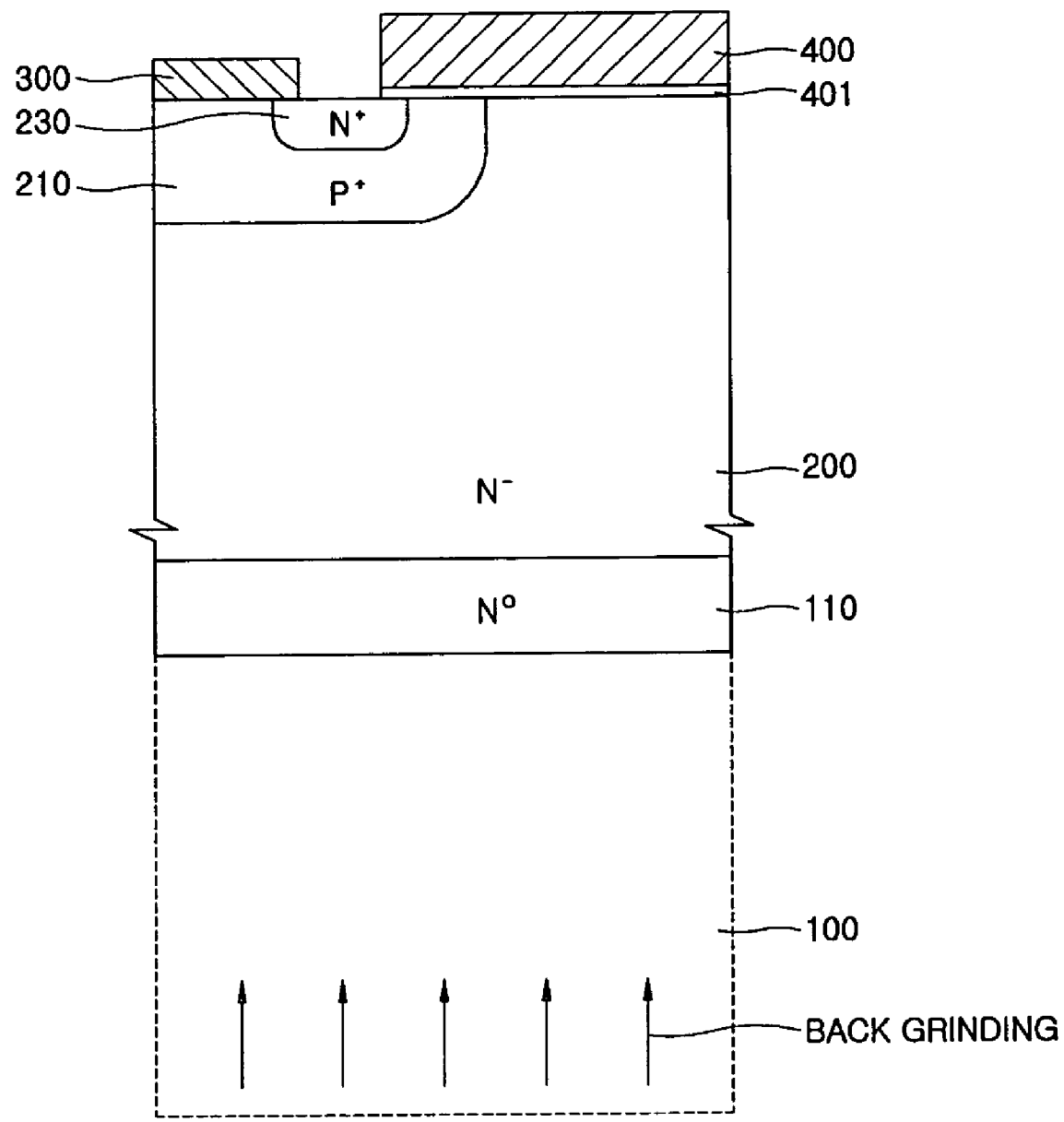

Referring to FIG. 4, a MOS manufacturing process is performed on the upper surface of the $N^-$ epitaxial layer 200, and then an FS region is formed from the $N^0$ semiconductor substrate 100. In the FS-IGBT structure, while the FS region is formed to a thickness smaller than that of the $N^-$ drift region, the $N^0$ semiconductor substrate 100 is formed to a relatively-large thickness.

Accordingly, a rear surface of the $N^0$ semiconductor substrate 100 is ground to reduce the thickness thereof. Since the P collector region is to be formed at the rear of the FS region; the remaining thickness of the semiconductor substrate 100 is determined after the grinding of the rear surface of the $N^0$ semiconductor substrate 100. For example, when the $N^-$ drift region is formed to a thickness of about 110 μm, the remaining thickness of the semiconductor substrate 100 for the FS region may be about 5 to 15 μm. At this time, the P collector region may be formed to a very-small thickness, for example, about 0.3 to 1 μm.

Those skilled in the art understand that alternate material removal techniques may be used to reduce the thickness of the $N^0$ semiconductor substrate 100 to the desired thickness 110. For example, the term grinding includes and is not limited to lapping and polishing. The semiconductor material may also be removed by chemical means, such as etching or by ablation or by a combination of chemical, physical and mechanical techniques.

In consideration of the remaining thickness, the rear surface of the $N^0$ semiconductor substrate 100 is ground to form a very-thin substrate 110, that is, a substantial FS layer 110. Since the FS region 110 is formed through the grinding of the rear surface of the semiconductor substrate 100, it is possible to preclude the annealing diffusion process and the high-energy ion implantation process for the FS region.

The ion implantation process has a limitation in expanding the thickness of the FS region. However, since the thickness of the FS region 110 is determined according to the extent of the grinding, the remaining thickness of the substrate 110 can be optionally set according to the extent of the grinding. Accordingly, it is possible to form the FS region 110 to a sufficient thickness.

Also, since the $N^0$ semiconductor substrate 100 maintains its sufficient thickness before the grinding, it can fully serve as a support substrate in a process of forming the $P^+$ base region 210, the $N^+$ emitter region 230, the emitter electrode 300, the gate electrode 400, and the subsequent insulating layer. Accordingly, it is possible to solve the limitations of processes that may occur due to the use of the conventional very-thin substrate, such as, a substrate drying process and a thermal treatment process for precluding the substrate drying process.

Figure 5:
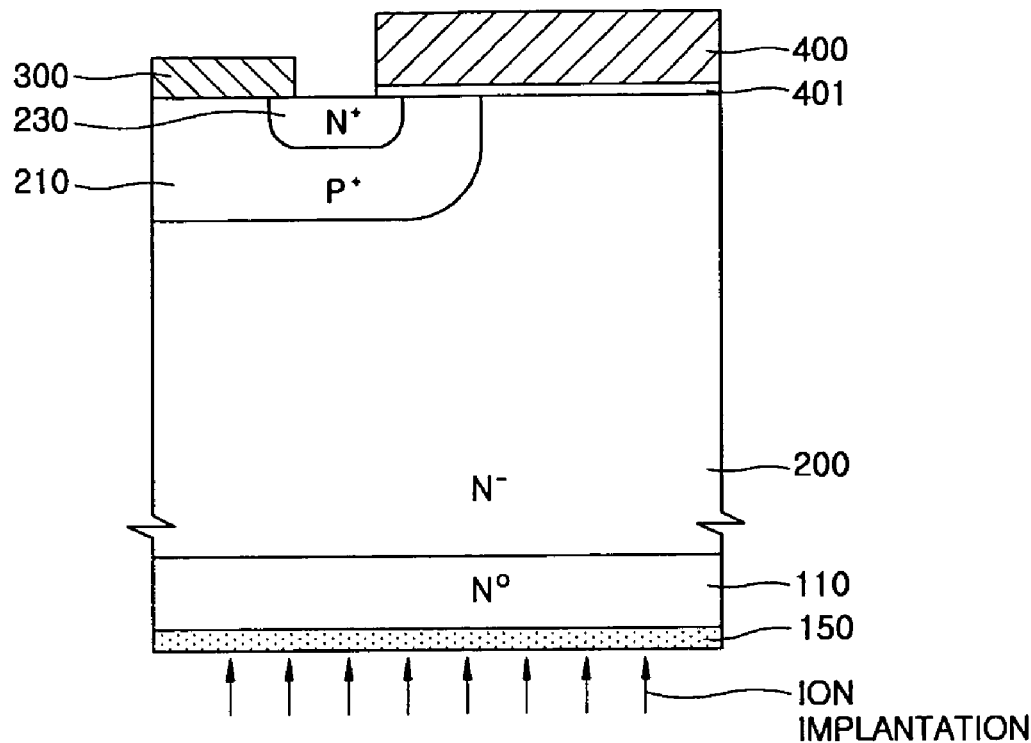

Referring to FIG. 5, impurities of the second conductivity type, for example, P-type impurities are doped into the ground surface of the semiconductor substrate 100 by ion implantation and is then annealed and diffused, thereby forming a P collector region 150 on the exposed rear surface of the FS region 110. At this time, the P collector region 150 can be understood as a region that is determined according to a switching off characteristic of the device and is implanted with ions of a concentration of about 1E11/cm$^3$ to 1E16/cm$^3$.

Figure 6:
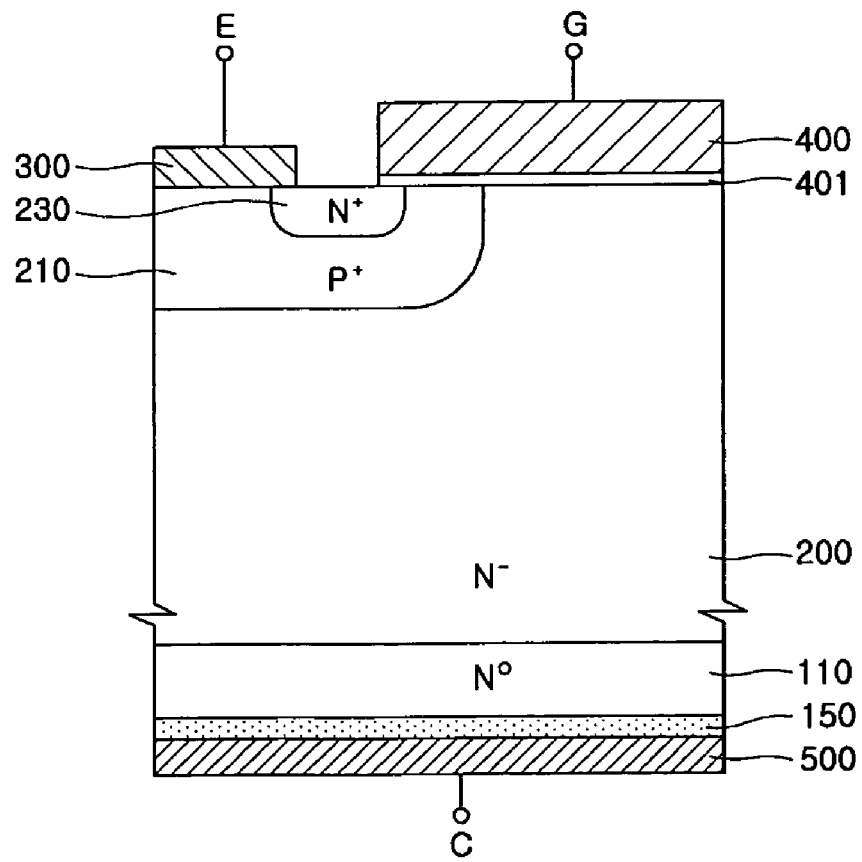

Referring to FIG. 6, a conductive layer is deposited on the P collector region 150 to form a collector electrode 500, thereby forming an FS-IGBT.

Figure 7:
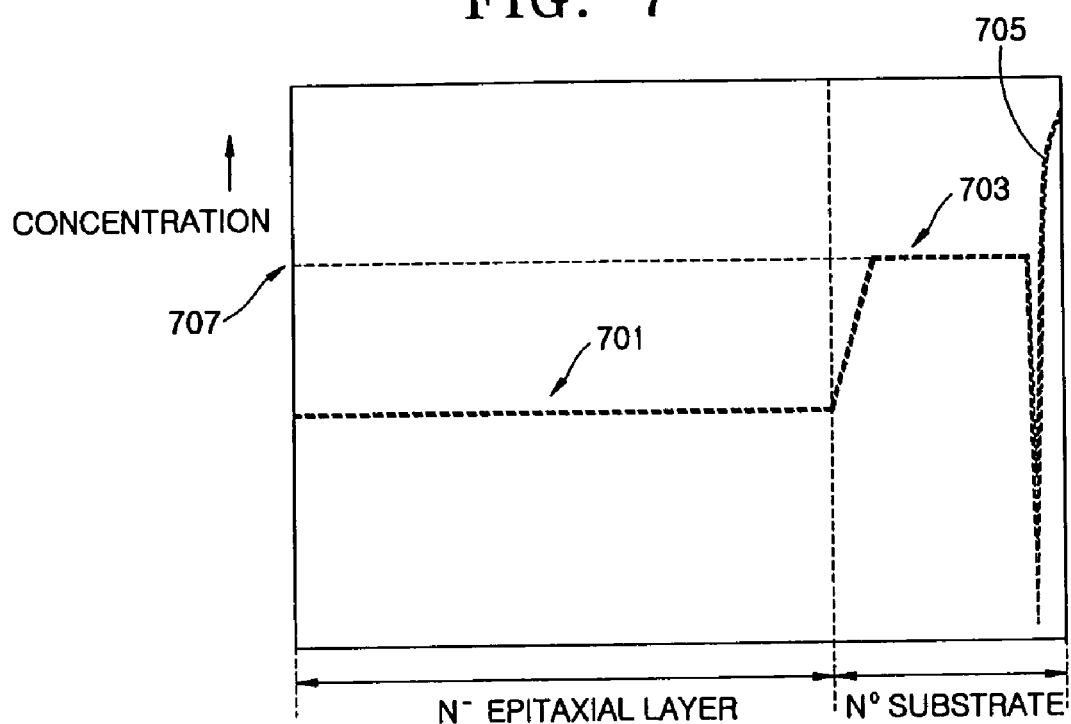
FIG. 7 is a graph illustrating an impurity concentration profile of the power semiconductor device depending on its vertical height.

FIG. 7 is a graph illustrating an impurity concentration profile of the power semiconductor device depending on its vertical height.

Referring to FIG. 7, the concentration of N-type impurities in an N⁻ epitaxial layer (200 in FIG. 6) that may be formed to a thickness of about 110 μm can have a constant profile 701 in a thickness direction. The impurity concentration profile 701 may be changed in the N⁻ epitaxial layer 200 by the adjustment of a doping concentration during the expitaxial growth.

The concentration of N-type impurities in an FS region (110 in FIG. 6) can have a constant profile 703 in a thickness direction. It can be understood that the impurity concentration profile 703 results from the concentration of an N⁰ semiconductor substrate (100 in FIG. 1). Accordingly, the N-type impurity concentration 703 can be constantly maintained in the FS region. The N-type impurity concentration 703 may be a concentration 707 required for prevention of the expansion of the depletion region, for example, about 1E15 to 2E16/cm³.

An impurity concentration 705 of a P collector region (150 in FIG. 6) contacting with the FS region 110 is determined according to the switching off characteristic of the device. The impurity concentration 705 may be about 1E11/cm³ to 1E16/cm³.

The constant concentration 703 of the N-type impurities in the FS region 110 is useful to improve the performance of the IGBT that has a tendency of a trade-off. That is, the constant concentration 703 is useful to uniformly control the density of holes implanted from a collector region (150 in FIG. 6) into an N⁻ drift region 200 and to effectively suppress the change of the saturation collector voltage $V_{ce,sat}$ and the turn-off loss $E_{off}$.

Figure 8:
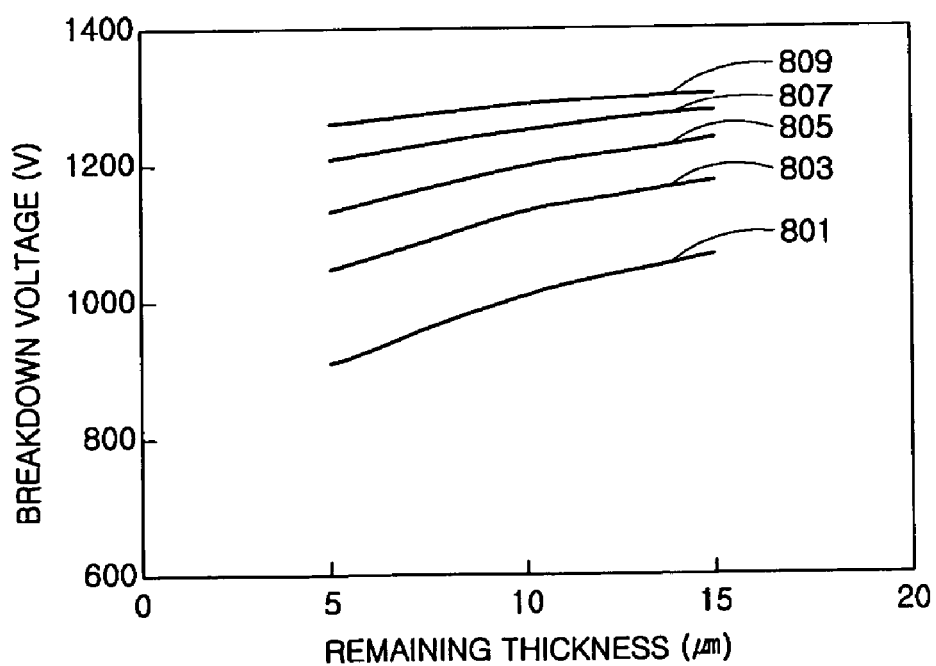
FIG. 8 is a graph illustrating a relationship between a breakdown voltage and the remaining thickness of an FS region in the power semiconductor device.

FIG. 8 is a graph illustrating a relationship between a breakdown voltage and the remaining thickness of the FS region in the power semiconductor device.

Referring to FIG. 8, the graph illustrates the relationship between the breakdown voltage and the remaining thickness of the substrate 100 for the FS region 110 when the N⁻ drift region 200 is epitaxially grown to a thickness of about 110 μm and the FS region 110 is formed through the grinding of the N⁰ semiconductor 100. Specifically, the graph illustrates the change of the breakdown voltage according to the change of the remaining thickness when the substrate 100 is an N-type substrate 801 with a concentration of about 1E15/cm³, an N-type substrate 803 with a concentration of about 2.5E15/cm³, an N-type substrate 805 with a concentration of about 5E15/cm³, an N-type substrate 807 with a concentration of about 1E16/cm³, or an N-type substrate 809 with a concentration of about 2E16/cm³. When the N⁰ semiconductor substrate 100 is ground for the FS region 110, it is possible to implement a sufficient breakdown voltage by the remaining thickness of about 5 to 15 μm.

Figure 9:
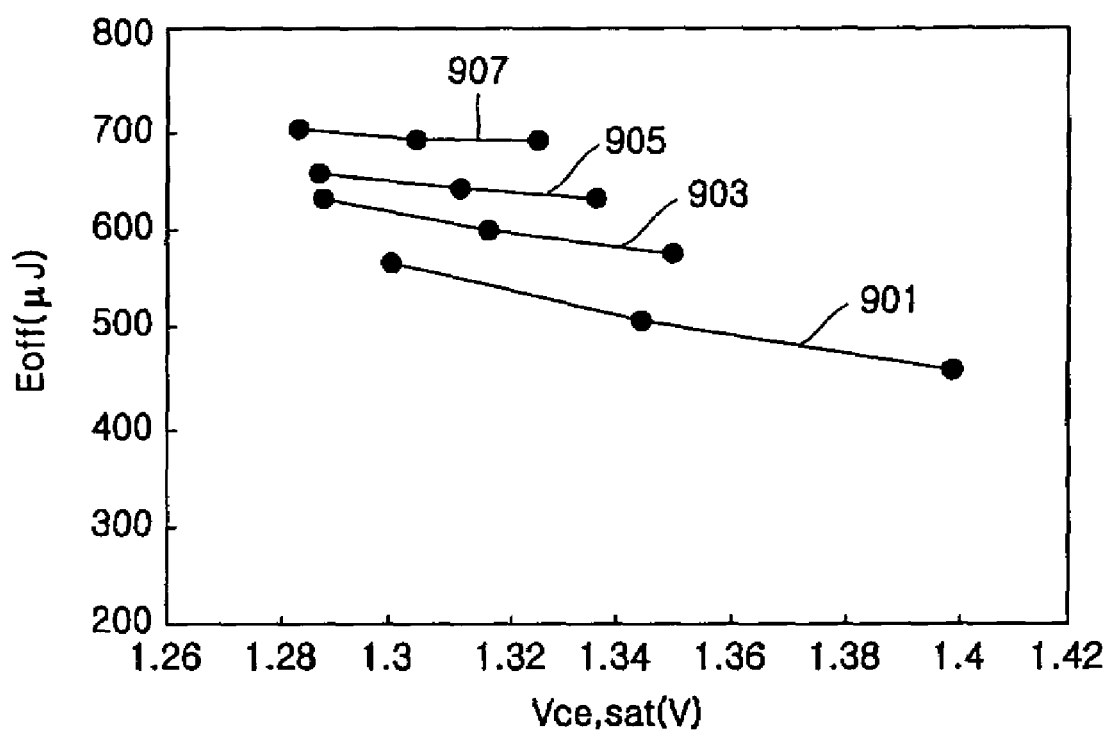
FIG. 9 is a graph illustrating a relationship between a turn-off loss $E_{off}$ and a saturation collector voltage $V_{ce,sat}$ depending on the remaining thickness of the FS region in the power semiconductor device.

FIG. 9 is a graph illustrating a relationship between the turn-off loss $E_{off}$ and the saturation collector voltage $V_{ce,sat}$ depending on the remaining thickness of the FS region in the power semiconductor device.

Referring to FIG. 9, when the IGBT device is implemented through the epitaxial growth of the N⁻ drift region 200 and the forming of the FS region 110 by the grinding of the N⁰ semiconductor substrate 100, it is possible to greatly reduce the change of the turn-off loss $E_{off}$ and the saturation collector voltage $V_{ce,sat}$.

Generally, a conventional IGBT device exhibits a trade-off in performance characteristics between saturation collector voltage $V_{ce,sat}$ that increases as turn-off loss $E_{off}$ decreases because the thickness of the FS layer in prior art devices greatly affects turn-off loss $E_{off}$ and saturation collector voltage $V_{ce,sat}$. However, according to the embodiments of the present invention, the change of the $V_{ce,sat}$ and the $E_{off}$ is small when the concentration of the FS region 110 is 1E16/cm³ (901), 5E15/cm³ (903), 2.5E15/cm³ (905), or E15/cm³ (907).

Even in the worst case 901 where the concentration is 1E16/cm³ (901), the change of the trade-off performance characteristic, that is, the change of the $V_{ce,sat}$ and the $E_{off}$ occurs at a degree of 0.1 V and 10%.

This result shows that the IGBT device according to the embodiment of the prevent invention can have a more stable characteristic.

As described above, the present invention makes it possible to implement the IGBT device that includes the N⁰ FS region of the substrate, the P collector formed by ion implantation, and the N⁻ drift region formed by epitaxial growth Since the FS region is formed through the grinding of the rear surface of the substrate, it is possible to preclude the high-energy ion implantation process for the FS region and the correspondent annealing diffusion process. The high-energy ion implantation process has a limitation in expanding the thickness of the FS region. However, since the thickness of the FS region is determined according to the extent of the grinding, the remaining thickness of the substrate can be optionally set according to the extent of the grinding. Accordingly, it is possible to form the FS region 110 to a sufficient thickness.

Since the FS region is formed from the N⁰ semiconductor substrate, the doping concentration thereof can be constant in the depth direction. Accordingly, it is possible to implement the constant characteristic-of the IGBT.

Also, since the N⁰ semiconductor substrate maintains its sufficient thickness before the grinding, it can fully serve as a support substrate in a process of forming the P⁺ base region, the N⁺ emitter region, the emitter electrode, and the gate electrode. Accordingly, it is possible to solve the limitations of processes that may occur due to the use of the conventional very-thin substrate, such as, a substrate drying process and a thermal treatment process for precluding the substrate drying process.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing a power semiconductor device, the method comprising:
   preparing a semiconductor substrate having a constant concentration profile of a first conductivity type impurities in a depth direction;
   growing an epitaxial layer on one surface of the semiconductor substrate, the epitaxial layer being doped at a concentration lower than that of the semiconductor substrate and being intended to be used as a drift region;
   forming a base region of a second conductivity type in a predetermined region of the epitaxial layer;
   forming an emitter region of the first conductivity type in a predetermined region of the base region;
   forming a gate electrode with a gate insulating layer on the base region between the emitter region and the drift region of the epitaxial layer;
   forming an emitter electrode contacting with the base region and the emitter region;

grinding a rear surface of the semiconductor substrate opposite the gate electrode to reduce the thickness of the semiconductor substrate, thereby setting an FS (field stop) region having a constant concentration profile of the first conductivity type impurities in a depth direction, wherein there is no need for ion-implantation and thermal treatment in order to form the field stop region; and forming a collector region of the second conductivity type on the ground surface of the semiconductor substrate of the FS region.

2. The method of claim 1, wherein the semiconductor substrate is an $N^0$ semiconductor substrate doped with the N-type impurities at a concentration of $1E15/cm^3$ to $2E16/cm^3$.

3. The method of claim 2, wherein the FS region is set to a portion of the $N^0$ semiconductor substrate remaining after the grinding, thereby having a constant concentration profile in the depth direction.

4. The method of claim 1, wherein the forming of the base region includes:

selectively ion-implanting impurities of the second conductivity type into a surface of the epitaxial layer; and diffusing the ion-implanted impurities.

5. The method of claim 1, wherein the forming of the emitter region includes:

selectively ion-implanting impurities of the first conductivity type into a surface of the base region; and diffusing the ion-implanted impurities.

6. The method of claim 1, wherein the collector region is formed to a constant depth below the ground surface of the remaining semiconductor substrate by ion implantation.

7. The method of claim 1, wherein the forming of the collector region includes:

ion-implanting impurities of the second conductivity type into the ground surface of the semiconductor substrate; and performing a thermal treatment process on the ion-implanted impurities.

8. The method of claim 1, further comprising:

forming an emitter electrode electrically connected to the emitter region; and forming a collector electrode electrically connected to the collector region.

9. The method of claim 1, wherein the FS region has a doping concentration lower than the collector region and greater than the drift region.

* * * * *

UNITED STATES PATENT AND TRADEMARK OFFICE
CERTIFICATE OF CORRECTION

| | |
|---|---|
| PATENT NO. | : 7,645,659 B2 |
| APPLICATION NO. | : 11/289823 |
| DATED | : January 12, 2010 |
| INVENTOR(S) | : Yun et al. |

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 722 days.

Signed and Sealed this

Twenty-eighth Day of December, 2010

David J. Kappos
*Director of the United States Patent and Trademark Office*